United States Patent [19]

Kudo et al.

[11] 4,179,326
[45] Dec. 18, 1979

[54] PROCESS FOR THE VAPOR GROWTH OF A THIN FILM

[75] Inventors: Daiziro Kudo, Yokohama; Kazuo Maeda, Chigasaki; Eiki Tanikawa, Kawasaki, all of Japan

[73] Assignee: Fujitsu Limited, Japan

[21] Appl. No.: 787,495

[22] Filed: Apr. 14, 1977

[30] Foreign Application Priority Data

Apr. 22, 1976 [JP] Japan .................................. 51-44922
Apr. 22, 1976 [JP] Japan .................................. 51-44923
Apr. 30, 1976 [JP] Japan .................................. 51-48507

[51] Int. Cl.$^2$ ............................................. B01J 17/26
[52] U.S. Cl. ..................................... 156/612; 156/613
[58] Field of Search ................................ 156/610–613; 148/174, 175; 427/86; 118/48, 49, 500

[56] References Cited

U.S. PATENT DOCUMENTS

| | | | |
|---|---|---|---|
| 3,657,004 | 4/1972 | Merkel et al. | 156/610 |
| 3,922,467 | 11/1975 | Pinchon | 148/175 |
| 4,018,183 | 4/1977 | Meuleman | 118/49 |

FOREIGN PATENT DOCUMENTS

| | | | |
|---|---|---|---|
| 2124392 | 11/1972 | Fed. Rep. of Germany | 148/174 |
| 2133843 | 1/1973 | Fed. Rep. of Germany | 148/174 |
| 2133876 | 1/1973 | Fed. Rep. of Germany | 148/174 |

Primary Examiner—Hiram H. Bernstein
Attorney, Agent, or Firm—Staas & Halsey

[57] ABSTRACT

Disclosed herewith is an improvement of the conventional process for the vapor growth of a thin film, such as the films of $SiO_2$, $Si_3N_4$, $Al_2O_3$ and polycrystalline Si, on a plurality of wafers, such as wafers of a semiconductor, under a reduced pressure. This improved process allows the growing of a uniformly thin film on each piece of wafer. According to the present invention, the location of the wafers is changed in accordance with a specific pressure within the reaction tube.

23 Claims, 12 Drawing Figures

Fig. 7

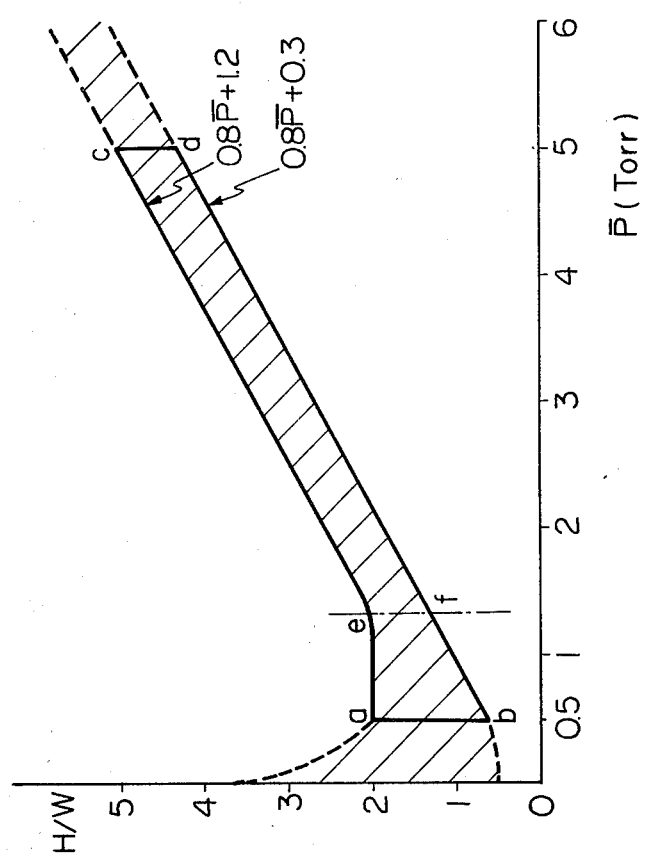

PROCESS FOR THE VAPOR GROWTH OF A THIN FILM

BACKGROUND OF THE INVENTION

1. Field of the Invention

The present invention relates to a process for the vapor growth of a thin film and, more particularly, to a process for the vapor growth of a thin film having a uniform thickness on a plurality of wafers.

2. Description of the Prior Art

The vapor growth technique is widely employed for growing a thin semiconductive, conductive or insulating film, on a substrate or wafer. The wafer is used for the manufacture of semiconductor devices referred to as IC, LSI and the like. In the vapor growth technique, a reaction gas are caused to flow through a reaction tube under normal or reduced pressure and brought into contact with the wafers arranged in the reaction tube.

In accordance with the requirement for increasing the production rate of wafers with a thin film thereon, the vapor growth process is widely performed under a reduced pressure, for example, 10 Torr. In this vapor growth under a reduced pressure, a plurality of wafers can be simultaneously treated in the reaction tube which usually has a circular cross-sectional space therein.

The conventional vapor growth process under a reduced pressure is, however, disadvantageous in that the thickness of a film grown on one piece of wafer by such process can occasionally be nonuniform. As a result of this nonuniform thickness of the thin film on one piece of wafer, the subsequent processes for treating the wafer, such as etching of the thin film, may become very complicated in order to produce a uniformly thick film all over the wafer after completion of such treating processes.

SUMMARY OF THE INVENTION

It is an object of the present invention to improve the vapor growth process under reduced pressure, thereby enabling the growth of a thin film which is uniformly thick on every part of the surface of the supporting wafer.

It is another object of the present invention to propose conditions which are pertinent for applying a wide variety of reaction gases presently employed in the semiconductor industry to the vapor growth process.

It is still another object of the present invention to provide a vapor growth process suited for growing a thin film on a plurality of wafers provided with a flat part around a part of the peripheral edge thereof.

The Inventors devoted themselves to the investigation of the vapor growths of thin films, and discovered that the thickness distribution of the film over one piece of wafer is greatly influenced by the location of the wafers in the reaction tube. In addition, the Inventors discovered that the optimum location of the wafers should be changed in accordance with the specific pressure within the reaction tube.

In the conventional process for the vapor growth of a thin film under a reduced pressure within a reaction tube, the wafers are arranged in parallel to each other and in the flow direction of a predetermined reaction gas flowing through the reaction tube, with the wafers arranged almost perpendicularly to the above-mentioned flow direction. This is improved by a particular feature of the present invention. This particular feature essentially requires that the wafers be arranged concentrically to the axis of the reaction tube, and further that the vapor growth be performed under a condition which satisfies the formula:

$$H/W = a \cdot \overline{P} + b, \qquad (1)$$

wherein H denotes a distance (in mm) between two adjacent exposed surfaces of the wafers; W denotes a width (in mm) between the inner wall of the reaction tube and the peripheral edge of each of the wafers; $\overline{P}$ denotes an average value of the reduced pressure which varies from less than 1.2 to 5.0 Torr; "a" denotes a constant of 0.8 Torr$^{-1}$; and "b" denotes a constant of from 0.3 to 1.2 which is determined by the predetermined reaction gas.

When the pressure $\overline{P}$ is from 0.5 to 1.2 Torr, the vapor growth is performed according to another feature of the invention and under a condition which satisfies the formula:

$$a \cdot \overline{P} + 0.3 \leq H/W \leq 2 \qquad (2)$$

The vapor growth process, according to the present invention, therefore, comprises the steps of: supporting a plurality of wafer pieces at a part or a few parts of the peripheral edge of each of the wafers; arranging the wafers in a reaction tube along the flowing direction of a reaction gas therein; forming a clearance between the inner wall of the reaction tube and the other unsupported parts of the peripheral edge of each piece of wafer; flowing the reaction gas through the reaction tube via the above-mentioned clearance; heating the wafers to a required temperature for depositing the film on the wafers; maintaining a pressure within the reaction tube at a predetermined reduced value. This involves placing the wafers essentially concentrically to the axis of the reaction tube, reducing the pressure to a predetermined average value $\overline{P}$, and determining the distance H between two adjacent exposed surfaces of the wafers and the width W of the clearance by utilizing the above-mentioned formulas (1) or (2).

The inner wall of the reaction tube defines a reaction chamber usually exhibiting a circular cross section, as wafers are generally available in round disc form either with or without a flat portion around a part of the edge. However, it is still possible to use a reaction tube which has a shape similar to the wafer even when the wafer is not in the form of a disc.

The wafer can consist of a semiconductive material, such as Si, Ge and GaAs and the like, or an insulating material, such as $Al_2O_3$ and the like. The wafer can also include a body of a material having various layers thereon, such as insulating and active layers. The number of wafers treated at a time is generally from 30 to 100 pieces, and preferably more than 40 pieces.

The wafer can have a diameter of 75 mm or less or even a diameter of 125 mm or less.

The values of W and H can be equal to any value when they satisfy one of the two equations (1) and (2); but the value of W should preferably be from 4 to 20 mm, and the value of H should preferably be from 8 to 40 mm, respectively.

The constant "b" of the formula (1) varies from 0.3 to 1.2 depending upon the kind of reaction gas. It was discovered by the Inventors that the preferably value of the constant "b" is mainly influenced by the molecular weight of the reaction gas or by the sum of the molecular weights of the reaction gases as listed below. The term "molecular weight of the reaction gas" is used below to include "sum of the molecular weights of the reaction gases".

Table I

| Molecular weight | Constant "b" |
|---|---|
| 30 or less | 0.3 |
| 50 | 0.5 |
| 60 | 0.6 |
| 65 | 0.7 |
| more than 100 | 1.0 |

Note: In this Table, the molecular weight means the molecular weight of the reaction gas.

The constant "b" should preferably be approximately one hundredth of the molecular weight of the gas which is required in the formation of the film during the vapor growth reaction, when this molecular weight does not exceed 100.

The constant "b" should be determined, depending upon the different kinds of reaction gas, in the following ways.

When the ratio of H/W is determined by the formula (2), this ratio should be varied between the maximum value of 2 and the minimum value of $a \cdot \overline{P} + 0.3$, depending upon the kind of the reaction gas. When the molecular mass of the reaction gas amounts to 30 or less, the ratio H/W equals the minimum value. When the molecular weight of the reaction gas ranges between 30 and 100, the equation determining the ratio H/W can be expressed by the formula:

$$H/W = c \cdot \overline{P} + d \quad (3)$$

the constant "c" decreases from 0.8 to 0 and the constant "d" increases from 0.3 to 2.0 in linear relationship with the increase in the molecular weight of the reaction gas from 30 to 100.

The constant "c" and "d" are, therefore expressed, respectively, by the formulae:

$$c = -\frac{0.8}{70}(M-30) + 0.8 \quad (4)$$

$$d = -\frac{1.7}{70}(M-30) + 0.3 \quad (5)$$

wherein the M indicates the molecular weight of the reaction gas.

When the number M amounts to 100, the ratio H/W equals the maximum value.

Although several of the known reaction gases are illustrated in Table III, it is also possible to employ other reaction gases, such as a combination of $SiCl_4$ and $H_2$, a combination of $AsCl_3$, $H_2$ and Ga, a combination of $AlCl_3$, $AsCl_3$, Ga and $H_2$, or a combination of $GeH_4$, $SiH_4$ and $O_2$. It is further possible to employ doping gases, such as phosphine and arsine. The reaction gas can be carried by a carrier gas such as Ar, $N_2$ and the like.

The vapor growth conditions can easily be calculated after the particular kind of reaction gas to be used has been determined.

Table II

| Kinds of reaction gas | Grown thin film | Reaction temperature (°C.) | Constant "b" |
|---|---|---|---|
| $SiH_4 + NH_3$ | $Si_3N_4$ | 700–900 | from 0.5 to 0.6, preferably 0.5 |
| $SiH_4 + NO$ | $SiO_2$ | 700–900 | from 0.6 to 0.7, preferably 0.6 |
| $SiH_4 + O_2$ | $SiO_2$ | 350–500 | from 0.7 to 0.8, preferably 0.7 |
| $SiH_4$ | poly-crystalline Si | 500–650 | from 0.3 to 0.5, preferably 0.3 |
| $AlCl_3 + H_2 + NO$ | $Al_2O_3$ | 750–950 | from 0.9 to 1.2, preferably 1.0 |
| $Me_mX_n + H_2$ | Me | 700–900 | from 0.9 to 1.2, preferably 1.0 |

Note: In this Table, Me denotes one metal chosen from the group of metals of Mo, W and the like; X denotes one halogen element chosen from the group of halogen elements of Cl, F and the like; and m and n are integers.

When the reaction:

$$3SiH_4 + 4NH_3 = Si_3N_4 + 12H_2$$

is carried out under a reduced pressure, for example, of 2.0 Torr at a temperature of 850° C., the formula (1) must be used, and the constant b is 0.5. The ratio H/W is therefore determined to be 2.1. If the value of W is 5 mm, as determined by both the inner diameter of the reaction tube and the diameter of the wafers, H should then be 10.5 mm. It is naturally possible to determine the value of either H or W first and, thereafter, determine the value of $\overline{P}$.

The film can be used, as is well known in the art, (1) for the purposes of insulation and protection for the underlying region of the wafer, and (2) as a conductor, electrode, semiconductor or the like, wherein the thickness of the thin film can be of any desired value ranging from 0.005 to 5 microns. The thickness distribution over the exposed surface of every piece of wafer is less than 10%, preferably less than 5%, with respect to the maximum thickness of the thin film. The thicknesses of the thin films are also uniform with regard to all the wafers treated at one time.

The apparatus for carrying out the vapor growth process of the invention comprises such conventional means as a reaction tube, a means for reducing the pressure within the reaction tube, and a means for placing a plurality of wafers in the reaction tube. This placing means essentially arranges the wafers concentrically to the axis of the reaction tube. A surrounding clearance is, therefore, formed between the inner wall of the reaction tube and the peripheral edge of the wafers, and has a predetermined width denoted as W. Furthermore, the placing means separates every two adjacent exposed surfaces of the wafers at a predetermined distance H. The average pressure within the vessel is adjusted according to formula (1) or (2).

The above-mentioned process according to the present invention is adapted to the following two embodiments thereof to grow a thin film having an extremely uniform thickness on wafers, which do not have a cross-sectional shape similar to that defined by the inner wall of the reaction chamber. According to these embodiments the flow of the reaction gas is distributed uniformly around the above-mentioned wafers.

The basic concept of these embodiments resides in that the width W is made equal around the entire inner wall of the reaction tube, by means of bringing a plate into contact with one of the two surfaces of each of the wafers, which have a cross-sectional shape not similar to that of the reaction chamber defined in the reaction tube.

The wafers, which have a cross-sectional shape not similar to that of the reaction chamber, are hereinafter referred to as non-similar wafers. An addition of a part, hereinafter referred to as a deficient part, to the non-similar wafers provides similar wafers having a cross-sectional shape similar to that of the reaction chamber.

According to the first embodiment, there is provided a plate, which has a cross-sectional shape similar to that of the reaction chamber and also a size greater than that of the wafers but smaller than that of the reaction chamber. This plate is brought into contact with one of the two surfaces of each water and is positioned concentrically to the axis of the wafer, thereby forming a clearance between the inner wall of the reaction tube and the peripheral edge of the plate. This clearance has the same width W around the entire periphery of the plate, the value of W being determined by the formulae (1) and (2).

According to the second embodiment, there is provided a plate, at least a part thereof being the same shape as the defficient part, and this plate is brought into contact with one of the two surfaces of each non-circular wafer, in such a manner that the same cross-sectional shape as that of the similar wafer is formed by the combination of the non-similar wafer and the plate. The clearance between the so formed cross-sectional shape and the inner wall of the reaction chamber has a thickness equal to the value W of the formulae (1) and (2).

BRIEF DESCRIPTION OF THE DRAWINGS

The present invention will now be illustrated in detail with reference to the accompanying drawings, wherein:

FIG. 7 illustrates a schematic, cross-sectional view of the wafers with a thin film formed thereon, and;

FIG. 8 is a graph representing the relationship between the ratio H/W and $\overline{P}$.

DETAILED DESCRIPTION OF THE PREFERRED EMBODIMENTS

Figure 1A:
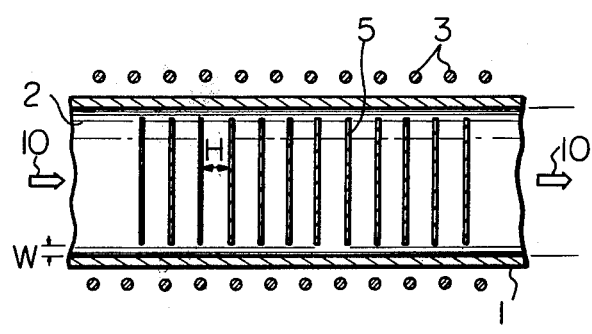
FIG. 1A illustrates a schematic, cross-sectional view of the vapor growth apparatus according to one embodiment of the invention.
Figure 1B:
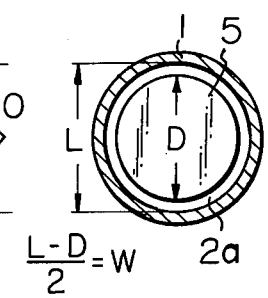
FIG. 1B illustrates a side view of FIG. 1A.

The apparatus for carrying out an embodiment of the present invention is constructed as shown in FIGS. 1A and 1B.

The inner wall of the reaction tube 1 defines a reaction chamber 2 which has a circular cross-section of a diameter L. The reaction gas are caused to flow, usually with the aid of a carrier gas, into the chamber 2 in the direction of the arrows 10 in FIG. 1. The heating means 3 for a resistance or induction heating surrounds the reaction tube 1. The wafers 5 are arranged in the reaction tube 1 at a constant distance H between every two adjacent exposed surfaces of the wafers. Each of the wafers 5 is made of two pieces of wafers 5a and 5b (as shown in FIG. 2B) which are brought into contact with each other for the gas treatment of the wafers in order to decrease the number of the exposed surfaces of the wafers, because it is usually sufficient to form the thin film on only one of the surfaces of each wafer. One of the surfaces is, therefore, exposed to the reaction gas. The wafers 5 (FIG. 2A) are placed concentrically to the longitudinal axis of the reaction tube 1. The annular clearance is therefore formed between the peripheral edges of the pieces of wafers 5 and the inner wall of the reaction tube 1 (FIG. 1B). The radial width W of the clearance is expressed by the formula:

$$W = (L - D)/2 \qquad (3)$$

A few pressure gauges (not shown) are communicated with the chamber 2 to measure the average pressure within the chamber 2.

Figure 2A:
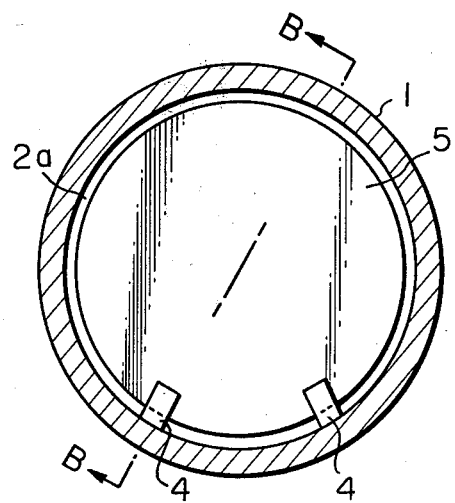
FIG. 2A illustrates a side elevational view of the reaction tube.
Figure 2B:
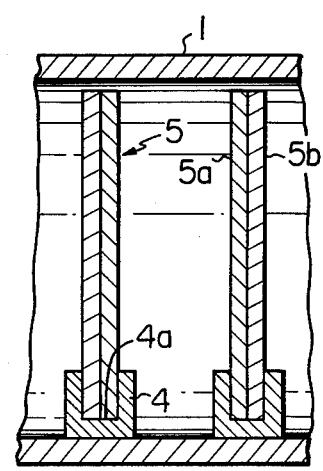
FIG. 2B is a sectional view taken along the line B—B of FIG. 2A.

FIGS. 2A and 2B illustrate an example of the supporting means in the form of a base plate 4 having a recess 4a. Two pieces 5a, 5b of the wafers 5 are removably inserted into the recess 4a, in such a manner that the edge of each of the wafers 5 is placed on the base plate 4. The annular clearance 2a thus formed in the chamber of the reaction tube 1 surrounds the peripheral edge of each of the wafers except for the edge supported by the base plate 4.

FIG. 2 illustrates an example of the supporting means 4 for positioning the wafers concentrically to the axis of the reaction tube 1. This means consists of two bases 4 secured to the inner wall of the reaction tube 1 and the two bases are separated from each other by an angle of approximately 60°. Each base 4 has a recess to removably support the wafer. According to the support method shown in the FIG. 2, the clearance between the peripheral edge of the wafers 5 and the inner wall of the reaction chamber has a constant thickness 2a around the wafer.

Figure 3:
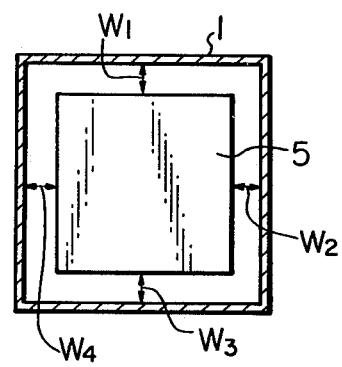
FIGS. 3 and 4 illustrate schematic side elevational views of the reaction tube for growing a thin film on the wafers.
Figure 4:
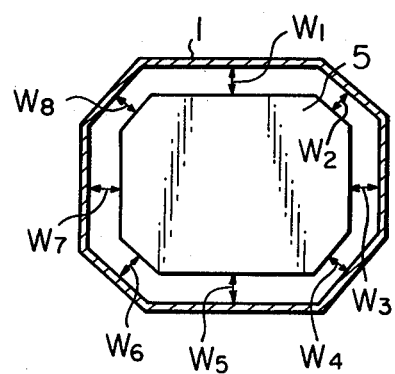

FIGS. 3 and 4 illustrate the method of supporting the polygonal wafers 5 within the reaction chamber 1. It will be understood that wafers 5 of polygonal shape can be placed in a reaction tube having a polygonal shape similar to that of the wafers, in such a manner that the wafers are supported in an essentially concentric relationship to the axis of the reaction tube. The clearance between the peripheral edge of the polygonal wafers 5 and the inner wall of the reaction tube 1 has a constant thickness around the wafers. This constant thickness, denoted as $W_1$ to $W_4$ in FIG. 3 and $W_1$ to $W_8$ in FIG. 4 is determined according to the formulae (1) or (2), in order to grow a film having a uniform thickness on a plurality of pieces of the wafers.

Figure 5A:
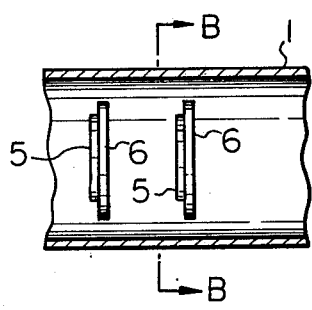
FIG. 5A illustrates a partial cross-sectional view of the reaction tube, in which a vapor growth according to an embodiment of the invention is carried out.
Figure 5B:
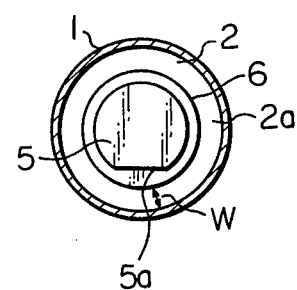
FIG. 5B is a cross-sectional view taken along the line B—B in FIG. 5A.

FIGS. 5A and 5B illustrate a preferable arrangement of the wafers 5 in the reaction tube 1, when the wafers 5 do not have a shape similar to the round reaction chamber 2, because the wafers 5 have a flat part 5a around the peripheral edge thereof. Each piece of the wafers 5 is removably secured to the disc plate 6, which can consist of one of carbon, silicon, alumina ($Al_2O_3$), or $SiO_2$. The axes of the wafers 5 and the plate 6 coincide with each other. The disc plate 6 is placed in the reaction tube 1 concentrically to the axis of the reaction tube 1, so that an annular clearance 2a, having an equal width W around the plate 6, is formed.

Figure 6A:
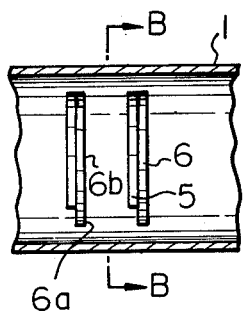
FIG. 6A is a similar figure to FIG. 5A.
Figure 6B:
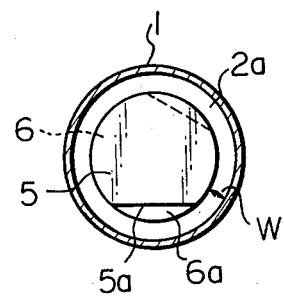
FIG. 6B is a cross-sectional view taken along the line B—B in FIG. 6A.

FIGS. 6A and 6B illustrate another preferable arrangement of the non-similar wafers. In this arrangement, the plate 6 has a part, denoted as 6a, which is of the same shape as the defficient part of the wafers 5a. The defficient part of the wafers 5 is supplemented by the part denoted as 6a of the plates 6, when the wafers 5 and the plates are viewed in the flowing direction of the reaction gas.

The plates 6 can consist of the same material as the wafers and have the same size as the wafers. In the case of combining two pieces of the wafers as shown in FIGS. 5A and 5B, the combined body of these two wafers are surrounded by an annular clearance having the same width W around the entire inner peripheral wall of the reaction tube 1. A uniform film can, therefore, be grown on the exposed surface of each of the wafers. The film also grows on the exposed defficient part 5a of the wafer, however, such growth does not cause trouble from a technical point in view.

The present invention is further illustrated in detail with reference to specific Examples.

EXAMPLE 1

The apparatus as shown in FIGS. 1A and 1B, as well as in FIGS. 2A and 2B, was used for the vapor growth of an $Si_3N_4$ film on forty pieces of Si wafers each having a diameter of 50 mm. Because the inner diameter L of the quartz reaction tube 1 was equal to 60 mm, the width of the clearance W was, therefore, 5 mm. The Si wafers were heated to a temperature of 850° C. The internal pressure of the reaction tube 1 was reduced by a vacuum pump (not shown in the FIGS). The reaction gas of monosilane $SiH_4$ with ammonia $NH_3$ were caused to flow from an inlet (not shown) to an outlet (not shown) of the reaction tube 1 in the direction depicted by the arrows 10 in FIG. 1. The average pressure inside the tube was adjusted to an almost constant value during the vapor growth while the reaction gas were flowing.

The distance between two adjacent exposed surfaces of the wafers was maintained constant with regard to all the wafers involved. Since the distance was varied for four different cases, that is 5, 10, 15 and 20 mm, the ratios H/W, that is, 1, 2, 3 and 4, respectively, were accordingly obtained. The average pressure $\overline{P}$ was respectively varied at 4, 2, 1 and 0.5 Torr. The thickness distribution of one thin film was investigated in relation to the variances of the ratio H/W and to the variances of the pressure $\overline{P}$. The results are illustrated in FIG. 7, wherein the view of the thickness of the thin film 8 has been enlarged with respect to that of the Si wafer 5, for a clear understanding of the thickness distribution of the thin film 8.

Figure 7:
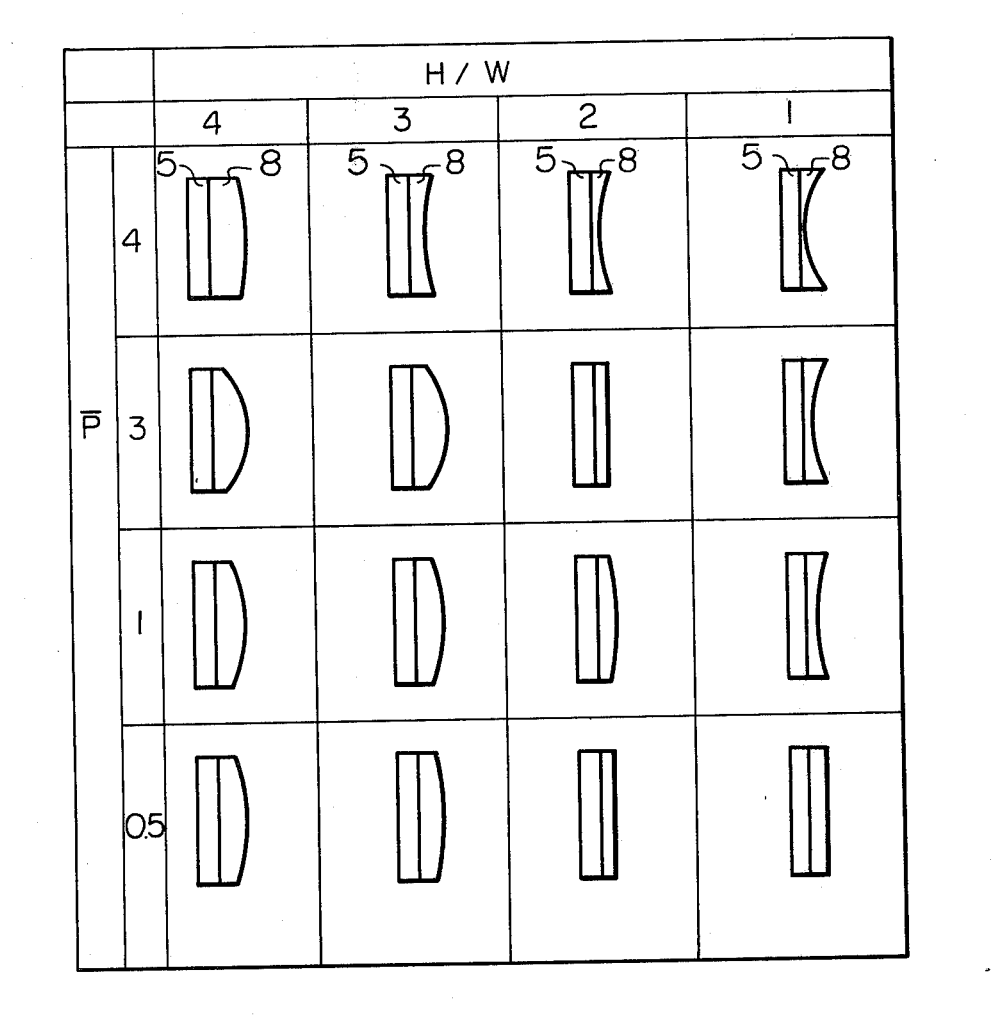

As understood from FIG. 7, the optimum values of the ratio H/W and the pressure $\overline{P}$ are: H/W=between 3 and 4 for $\overline{P}$=4 Torr; H/W=approximately 2 for $\overline{P}$=3 Torr; H/W=between 1 and 2 for $\overline{P}$=1 Torr; and, H/W=1 and 2 for $\overline{P}$=0.5 Torr. It is concluded from these optimum values that a definite relationship exists between the ratio H/W and the pressure $\overline{P}$.

EXAMPLE 2

The following reaction gases:
(1) $SiH_4+NH_3$; (2) $SiH_4+NO$; (3) $SiH_4+O_2$; (4) $SiH_4$; (5) $AlCl_3+H_2+NO$; (6) $Cr(CO)_6+H_2$, and; (7) $MoCl_5+H_2$ were used to determine the relationship between the ratio H/W and the average pressure $\overline{P}$, in order to produce a thin film having a thickness distribution of within ±10% of the maximum thickness of film.

The ratio H/W and the pressure $\overline{P}$ were varied below 6 and 6 Torr, respectively, and the respective pertinent ranges of H/W and $\overline{P}$ for obtaining a thin film with a desired distribution thereof were proved to be represented within the hatched area of FIG. 8.

As is clear from FIG. 8, the ratio H/W should be varied in relation to the pressure $\overline{P}$ in accordance with the linear expression:

$$H/W = a \cdot \overline{P} + b \qquad (1)$$

when $\overline{P}$ exceeds 1.2 Torr. It is possible to determine from the respective gradients of the linear lines $\overline{ec}$ and $\overline{fd}$ that the value of the constant "a" is 0.8 Torr$^{-1}$. The constant "b" is then determined to be 0.3 and 1.2, respectively, with regard to the lines $\overline{fd}$ and $\overline{ec}$, respectively. The pressure $\overline{P}$ should not exceed 5 Torr from the point of view of increasing the number of wafers treated at one time, because the distance between two adjacent exposed surfaces of the wafers will be considerably increased. As a result of the experiments, the following correspondence was found between the constant "b" and the reaction gases. Accordingly, the largest value 1.2 of the constant "b" should be selected for the reaction gases (6) and (7) of this Example, and the smallest value 0.3 of the constant "b" should be selected for the reaction gas (4). The values of 0.5, 0.6 and 0.7 of the constant "b" should be selected for the reaction gas (1), (2) and (3), respectively.

When the pressure $\overline{P}$ is from 0.5 to 1.2 Torr, the preferable ratio H/W is then expressed by the formula:

$$a \cdot \overline{P} + 0.3 \leq H/W \leq 2 \qquad (2)$$

The preferable ratio H/W is 2 or $a \cdot \overline{P} + 0.3$ in relation to the reaction gases (6) and (7), or in relation to the reaction gas (4), respectively. When the pressure $\overline{P}$ is below 0.3 Torr, the growth rate of a thin film is too low.

What we claim is:
1. A process for the vapor growth of a thin film on the exposed surface of each of a plurality of wafers, said method comprising the steps of:
   supporting said plurality of wafers at their peripheral edges within, and essentially concentric with and substantially perpendicular to the axis of, a reaction tube, to provide a constant clearance W between the inner wall of said reaction tube and said wafers around substantially the entire portion of said peripheral edges, and said wafers being arranged to have a constant distance H between adjacent pairs of said exposed surfaces;
   flowing a reaction gas through said reaction tube via said clearance W;
   heating said wafers to a required uniform temperature for depositing said film on said wafers; and
   maintaining a pressure within said reaction tube at a predetermined reduced average value $\overline{P}$;
   wherein said supporting step comprises arranging said wafers so that the ratio of said H to said W is determined by

$$H/W = a \cdot \overline{P} + b \qquad (1)$$

in the range $1.2 \leq \overline{P} \leq 5.0$ Torr, wherein "a" $\leq 0.8$ Torr$^{-1}$ and "b" is a constant in the range from 0.3 to 1.2 depending on the kind of said reaction gas, and by $$0.8\overline{P}+0.3=H/W=2 \qquad (2)$$

in the range $0.5 \leq \overline{P} \leq 1.2$ Torr.

2. A process according to claim 1, wherein said "b" is approximately one hundredth of the the molecular mass of said reaction gas.

3. A process according to claim 1, wherein said reaction gas is $SiH_4$, wherein said thin film is polycrystalline silicon, and said constant "b" is in the range from 0.3 to 0.5.

4. A process according to claim 3, wherein said constant "b" is 0.3.

5. A process according to claim 1, wherein said reaction gas comprises $SiH_4$ and $NH_3$, said thin film comprises $Si_3N_4$, and said constant "b" is chosen in the range from 0.5 to 0.6.

6. A process according to claim 5, wherein said constant "b" is 0.5.

7. A process according to claim 1, wherein said reaction gas comprises $SiH_4$ and NO, said thin film is $SiO_2$, and said constant "b" is chosen between 0.5 to 0.6.

8. A process according to claim 7, wherein said constant "b" is 0.6.

9. A process according to claim 1, wherein said reaction gas comprises $SiH_4$ and $O_2$, said thin film comprises $SiO_2$, and said constant "b" is chosen in the range from 0.7 to 0.8.

10. A process according to claim 9, wherein said constant "b" is 0.7.

11. A process according to claim 1, wherein said reaction gas comprises $ALCL_3$, $H_2$ and NO, said thin film comprises $AL_2O_3$, and said constant "b" is chosen in the range from 0.9 to 1.2.

12. A process according to claim 11, wherein said constant "b" is 1.0.

13. A process according to claim 1, wherein said reaction gas comprises a metal halide and hydrogen gas, said metal being selected from the group of metals consisting of Mo and W, said thin film comprising said metal, and said constant "b" is chosen in the range from 0.9 to 1.2.

14. A process according to claim 13, wherein said constant "b" is 1.0.

15. A process according to claim 1, wherein the ratio H/W in formula (2) is determined by:

$$H/W = c \cdot \overline{P} + d,$$

where "c" is a constant that decreases from 0.8 to 0, and "d" is a constant that increases from 0.3 to 2.0, in linar relation with increase in the molecular weight of said reaction gas from 30 to 100.

16. A process for vapor growth of a thin film on the exposed surface of each of a plurality of wafers in a reaction tube, said wafers having a shape not similar to the cross-sectional shape of said reaction tube, said method comprising the steps of:
providing plates having a shape similar to but smaller than the cross-section of said wafers;
placing each of said wafers flat against a respective one of said plates with each said plate being essentially concentric with the respective wafer;
supporting a plurality of the combined pieces of said wafers and plates at the peripheral edges of said combined pieces and essentially concentric with and substantially perpendicular to the axis of said reaction tube, with a constant clearance W for substantially the entire area between the inner wall of said reaction tube and said peripheral edge of each of said combined pieces, said combined pieces being arranged to provide a constant distance H between successive pairs of said exposed surfaces,
flowing said reaction gas through said reaction tube via said clearance H;
heating said wafers to a uniform required temperature for depositing said film on said wafers; and
maintaining a pressure within said reaction tube to a predetermined reduced average value $\overline{P}$;
wherein said
arranging said combined pieces so that the ratio of said H to said W is determined by the formula $$H/W = a \cdot \overline{P} + b,$$

in the range $1.2 \leq \overline{P} \leq 5.0$ Torr, wherein "a" $\leq 0.8$ Torr$^{-1}$ and "b" is a constant in the range from 0.3 to 1.2 depending on the kind of said reaction gas selected and by $$0.8\overline{P}+0.3=H/W=2$$

in the range $0.5 \leq \overline{P} \leq 1.2$ Torr.

17. The method of claim 16, said wafers having a shape similar to said cross-section of said reaction tube, except for a deficient part of said wafers, and said plates providing only said deficient part to the combined shape of said wafer and said plate.

18. The method of claim 16, one of said wafers being mounted on each side of said respective plate.

19. The method of claim 2, wherein pairs of said wafers are mounted together.

20. The method of claim 1, said reaction tube having a circular shape.

21. The method of claim 16, said reaction tube having a circular shape.

22. The method of claim 1, said reaction tube having a polygon shape.

23. The method of claim 16, said reaction tube having a polygon shape.

* * * * *

UNITED STATES PATENT AND TRADEMARK OFFICE
CERTIFICATE OF CORRECTION

PATENT NO. : 4,179,326
DATED : December 18, 1979
INVENTOR(S) : Daiziro Kudo et al.

It is certified that error appears in the above-identified patent and that said Letters Patent are hereby corrected as shown below:

Col. 2, line 66, "preferably" should be --preferable--;

Col. 3, line 35, "the" (first occurrence) should be --The--.

Signed and Sealed this

Tenth Day of June 1980

[SEAL]

Attest:

SIDNEY A. DIAMOND

Attesting Officer — Commissioner of Patents and Trademarks

UNITED STATES PATENT AND TRADEMARK OFFICE
CERTIFICATE OF CORRECTION

PATENT NO. : 4,179,326
DATED : December 18, 1979
INVENTOR(S) : Daiziro Kudo et al.

It is certified that error appears in the above—identified patent and that said Letters Patent is hereby corrected as shown below:

Column 9, line 3, (equation (2)), each of the two equality signs "=" should be an inequality sign of the type $--\leq--$.

Column 10, line 36, (equation (2)), each of the two equality signs "=" should be an inequality sign of the type $--\leq--$.

Signed and Sealed this

Fourteenth Day of July 1981

[SEAL]

Attest:

GERALD J. MOSSINGHOFF

*Attesting Officer*   *Commissioner of Patents and Trademarks*